US012557219B2

(12) United States Patent
Kuo et al.

(10) Patent No.: US 12,557,219 B2
(45) Date of Patent: Feb. 17, 2026

(54) CIRCUIT BOARD STRUCTURE AND FABRICATION METHOD THEREOF

(71) Applicant: UNIMICRON TECHNOLOGY CORP., Taoyuan (TW)

(72) Inventors: Chun Hung Kuo, Taoyuan (TW);
Kuo-Ching Chen, Taoyuan (TW);
Yu-Cheng Huang, Taoyuan (TW);
Yu-Hua Chen, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 186 days.

(21) Appl. No.: 18/388,483

(22) Filed: Nov. 9, 2023

(65) Prior Publication Data
US 2025/0089173 A1 Mar. 13, 2025

(30) Foreign Application Priority Data
Sep. 8, 2023 (TW) .................................. 112134274

(51) Int. Cl.
*H05K 1/16* (2006.01)
*H01F 27/28* (2006.01)
*H05K 1/183* (2026.01)

(52) U.S. Cl.
CPC .......... *H05K 1/165* (2013.01); *H01F 27/2804* (2013.01); *H05K 1/183* (2013.01); *H05K 2201/0183* (2013.01)

(58) Field of Classification Search
CPC ................. H05K 1/183; H05K 3/4038; H05K 2201/0183; H05K 2203/049; H05K 1/165; H01F 27/2804
See application file for complete search history.

(56) References Cited

U.S. PATENT DOCUMENTS

| | | | |
|---|---|---|---|
| 8,222,714 B2 | 7/2012 | Shi et al. | |
| 9,412,734 B2 | 8/2016 | Zhou et al. | |
| 10,236,854 B2 | 3/2019 | Hurwitz et al. | |
| 10,546,915 B2 | 1/2020 | Reznicek et al. | |
| 10,586,774 B2 | 3/2020 | Shimoichi et al. | |
| 2007/0296519 A1* | 12/2007 | Ezzeddine | H01P 5/185 333/131 |
| 2009/0323251 A1* | 12/2009 | Naskali | G03B 15/05 361/270 |
| 2014/0062641 A1* | 3/2014 | Chen | H01F 27/2804 29/25.01 |
| 2017/0032882 A1* | 2/2017 | Yang | H01F 27/2804 |

FOREIGN PATENT DOCUMENTS

TW 202203335 A 1/2022

* cited by examiner

*Primary Examiner* — Steven T Sawyer
(74) *Attorney, Agent, or Firm* — Maschoff Brennan

(57) ABSTRACT

A circuit board structure includes a core, a wiring layer and a buried passive component. The wiring layer and the buried passive component are disposed on the core, and the buried passive component is electrically connected to the wiring layer. The buried passive component includes a first spiral metal layer, a second spiral metal layer and a dielectric interlayer. The first spiral metal layer is intertwined with the second spiral metal layer. The dielectric interlayer is disposed between the first spiral metal layer and the second spiral metal layer. The first spiral metal layer and the second spiral metal layer are spaced apart by the dielectric interlayer at least in the core.

9 Claims, 10 Drawing Sheets

CIRCUIT BOARD STRUCTURE AND FABRICATION METHOD THEREOF

This application claims priority under 35 U.S.C. § 119(a) on Patent Application No(s). 112134274 filed in Taiwan, R.O.C. on Sep. 8, 2023, the entire contents of which are hereby incorporated by reference.

BACKGROUND

1. Technical Field

The present disclosure relates to a circuit board structure, more particularly to a circuit board structure including buried passive component.

2. Related Art

As the demand of electronic products are trending towards multi-functionality, high signal transmission speed and high component density, the functionality of an integrated circuit chip is enhancing, and the number of passive components for a consumer electronic product is also increasing dramatically.

Due to the requirement of impedance matching, inductors and capacitors are essential in circuit board design. With the development of high-density circuit board to achieve compactness and thinning, the arrangement of inductors and capacitors in a limited space is a problem to be solved in this technical field.

SUMMARY

According to one embodiment of the present disclosure, a circuit board structure includes a core, a wiring layer and a buried passive component. The wiring layer and the buried passive component are disposed on the core, and the buried passive component is electrically connected to the wiring layer. The buried passive component includes a first spiral metal layer, a second spiral metal layer and a dielectric interlayer. The first spiral metal layer is intertwined with the second spiral metal layer. The dielectric interlayer is disposed between the first spiral metal layer and the second spiral metal layer. The first spiral metal layer and the second spiral metal layer are spaced apart by the dielectric interlayer at least in the core.

According to one embodiment of the present disclosure, the dielectric interlayer is in a shape of spiral.

According to one embodiment of the present disclosure, the first spiral metal layer and the second spiral metal layer extend through the core in a thickness direction of the core.

According to one embodiment of the present disclosure, the dielectric interlayer includes a sandwiched portion, a first dielectric via and a second dielectric via connected to one another. The sandwiched portion is disposed between the first spiral metal layer and the second spiral metal layer. The first dielectric via and the second dielectric via extend through the core in the thickness direction of the core. The first dielectric via is located at one side of each of the first spiral metal layer and the second spiral metal layer, and the second spiral metal layer is located at opposite side of each of the first spiral metal layer and the second spiral metal layer.

According to one embodiment of the present disclosure, the wiring layer includes a wiring and a dielectric layer. The dielectric layer is disposed on the core, and the wiring is located in the dielectric layer. The wiring is electrically connected to the first spiral metal layer or the second spiral metal layer. A material of the dielectric interlayer has a greater dielectric constant than a material of the dielectric layer of the wiring layer, but the present disclosure is not limited thereto.

According to one embodiment of the present disclosure, the buried passive component further includes a magnetic element disposed in the core. The magnetic element is spaced apart from the first spiral metal layer, the second spiral metal layer and the dielectric interlayer. The first spiral metal layer and the second spiral metal layer surround the magnetic element.

According to one embodiment of the present disclosure, the buried passive component further includes a conductive through hole disposed in the core. The first spiral metal layer and the second spiral metal layer surround the conductive through hole, and the conductive through hole is electrically connected to the second spiral metal layer through the wiring layer.

According to one embodiment of the present disclosure, the second spiral metal layer includes an outer turn and an inner turn connected to each other, and the conductive through hole is electrically connected to the inner turn.

According to one embodiment of the present disclosure, each of the first spiral metal layer and the second spiral metal layer forms an inductor.

According to one embodiment of the present disclosure, the first spiral metal layer, the second spiral metal layer and dielectric interlayer together form a capacitor.

According to one embodiment of the present disclosure, a fabrication method of circuit board structure includes the following steps: forming a spiral trench in a core; forming a metal layer comprising a lateral portion on a side wall of the spiral trench and a base portion on a bottom surface of the spiral trench; removing part of the lateral portion of the metal layer; forming a dielectric interlayer in contact with the metal layer in the spiral trench; removing the base portion of the metal layer, and part of the lateral portion remained on the side wall of the spiral trench forms a first spiral metal layer and a second spiral metal layer; and forming a wiring electrically connected to at least one of the first spiral metal layer and the second spiral metal layer.

According to one embodiment of the present disclosure, the step of removing part of the lateral portion of the metal layer includes: removing part of the core and part of the lateral portion to form a through hole communicated with the spiral trench.

According to one embodiment of the present disclosure, the step of forming the dielectric interlayer in the spiral trench includes: filling a dielectric material in the spiral trench and the through hole to form the dielectric interlayer.

According to one embodiment of the present disclosure, the step of removing the base portion of the metal layer includes: removing the base portion and thinning the core by polishing.

According to one embodiment of the present disclosure, the metal layer further includes a top portion connected to the lateral portion on a surface of the core.

According to one embodiment of the present disclosure, the fabrication method of circuit board structure further includes: removing the top portion of the metal layer.

According to one embodiment of the present disclosure, the fabrication method of circuit board structure further includes: forming a dielectric layer on the surface of the core, and the wiring is disposed in the dielectric layer.

According to one embodiment of the present disclosure, the material of the dielectric interlayer has a greater dielectric constant than the material of the dielectric layer, but the present disclosure is not limited thereto.

It is to be understood that both the foregoing general description and the following detailed description are by examples, and are intended to provide further explanation of the disclosure as claimed.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present disclosure. The following embodiments further illustrate various aspects of the present disclosure, but are not meant to limit the scope of the present disclosure.

Figure 1:
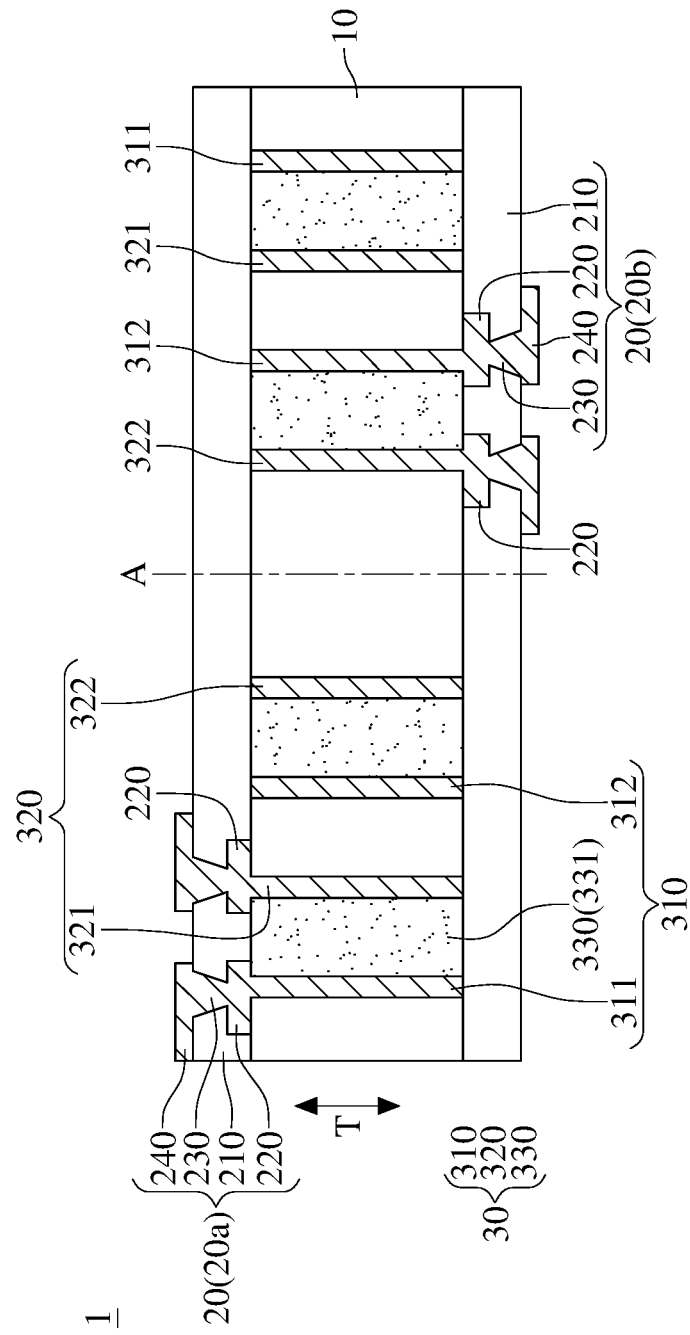
FIG. 1 is a schematic view of a circuit board structure according to one embodiment of the present disclosure.
Figure 2:
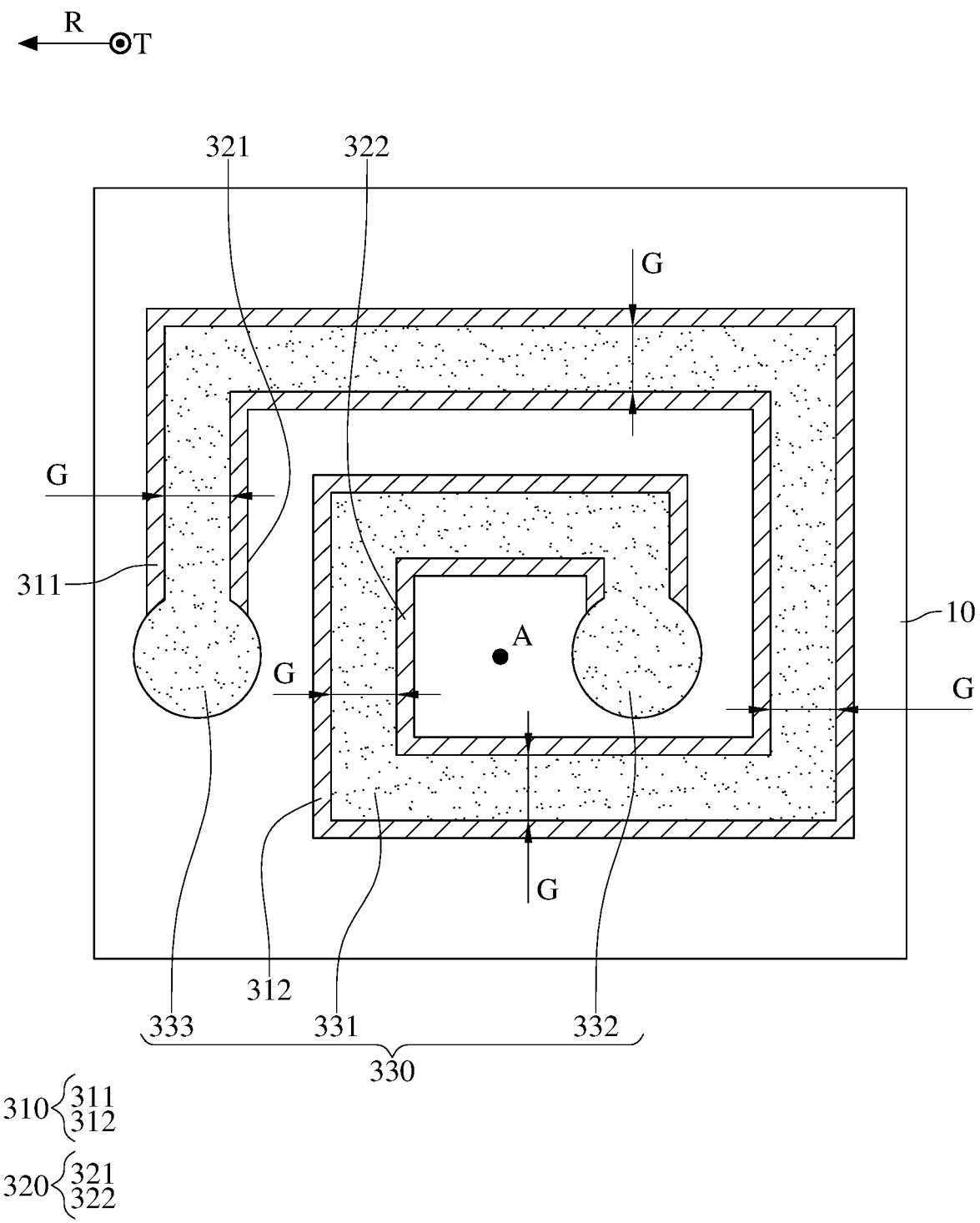
FIG. 2 is a top view of a core and a buried passive component of the circuit board structure in FIG. 1.

Please refer to FIG. 1 and FIG. 2. FIG. 1 is a schematic view of a circuit board structure according to one embodiment of the present disclosure, and FIG. 2 is a top view of a core and a buried passive component of the circuit board structure in FIG. 1. In this embodiment, a circuit board structure 1 includes a core 10, a wiring layer 20 and a buried passive component 30. The core 10, for example, may be an electrically insulated substrate made of glass fiber and/or epoxy resin.

The wiring layer 20 is disposed on a surface of the core 10. FIG. 1 exemplarily depicts that two wiring layers 20 are disposed on opposite surfaces of the core 10, respectively, while the present disclosure is not limited by the number of wiring layers 20. Each of the wiring layers 20 may include a dielectric layer 210, a wiring 220, a conductive blind hole 230 and an electrode interconnection 240. The dielectric layer 210 may be made of a composite material containing bakelite, glass fiber, epoxy resin, polyimide or other organic polymer materials, and fillers. The wiring 220 and the conductive blind hole 230 are disposed in the dielectric layer 210 and electrically connected to each other. The electrode interconnection 240 exposes to the outside of the dielectric layer 210. For the purpose of illustration, the wiring layer 20 on the core 10 may be interpreted as an upper wiring layer 20a, and the wiring layer 20 under the core 10 may be interpreted as a lower wiring layer 20b. It is noted that the present disclosure is not limited to the exemplary wiring layer 20 disclosed in this embodiment. In some other embodiments, the wiring layer may include one or more conductive through holes and additional wiring connected thereto.

The buried passive component 30 is disposed in the core 10 and electrically connected to the wiring layer 20. Specifically, the buried passive component 30 includes a first spiral metal layer 310, a second spiral metal layer 320 and a dielectric interlayer 330. The first spiral metal layer 310 and the second spiral metal layer 320 may extend through the core 10 in a thickness direction T of the core 10. The dielectric interlayer 330 is located between the first spiral metal layer 310 and the second spiral metal layer 320 and conformed in a shape of spiral. The first spiral metal layer 310 and the second spiral metal layer 320 are spaced apart by the dielectric interlayer 330 at least in the core 10. A material of the dielectric interlayer 330 may have a greater dielectric constant than a material of the dielectric layer 210. For example, the dielectric interlayer 330 may be made of epoxy-ceramic composites with high dielectric constant.

The term "spiral metal layer" used herein refers to two-dimensional spiral coil instead of a three-dimensional helix coil. A thickness of said two-dimensional spiral coil is defined along the thickness direction T, and the thickness of said two-dimensional spiral coil may be equal to the thickness of the core 10.

The first spiral metal layer 310 and second spiral metal layer 320 are intertwined with each other. Specifically, as shown in FIG. 1 and FIG. 2, the first spiral metal layer 310 includes an outer turn 311 and an inner turn 312 connected to each other. The first spiral metal layer 310 extends around the reference axis A, and a distance between the first spiral metal layer 310 and the reference axis A decreases gradually or stepped from the outer turn 311 to the inner turn 312. The second spiral metal layer 320 includes an outer turn 321 and an inner turn 322 connected to each other. The second spiral metal layer 320 extends around the reference axis A, and a distance between the second spiral metal layer 320 and the reference axis A decreases gradually or stepped from the outer turn 321 to the inner turn 322. In this embodiment, each spiral metal layer may be a coil with at least two turns, the outermost turn may be interpreted as the aforementioned outer turn, and the innermost turn may be interpreted as the aforementioned inner turn.

Moreover, the second spiral metal layer 320 passes through an opening formed between the outer turn 311 and the inner turn 312 of the first spiral metal layer 310, such that at least part of the second spiral metal layer 320 is surrounded by the first spiral metal layer 310. In a radial direction R of the core 10, which is substantially orthogonal to the thickness direction T, a constant spacing G between the first spiral metal layer 310 and the second spiral metal layer 320 may be provided.

FIG. 2 exemplarily depicts that the first spiral metal layer 310 and the second spiral metal layer 320 in this embodiment are both in a shape of square spiral, but the present disclosure is not limited thereto. In some other embodiments, the spiral metal layer may be in a shape of circular spiral, hexagonal spiral or octagonal spiral. The specific shapes of the first spiral metal layer 310 and the second spiral metal layer 320 may be the same or different from each other.

The dielectric interlayer 330 may include a sandwiched portion 331, a dielectric via 332 and a dielectric via 333 connected to one another. The sandwiched portion 331 is disposed between the first spiral metal layer 310 and the second spiral metal layer 320 in the radial direction R. The sandwiched portion 331, the dielectric via 332 and the dielectric via 333 extend through the core 10 in the thickness direction T. The dielectric via 332 is located at one side of each of the first spiral metal layer 310 and the second spiral metal layer 320. Specifically, the dielectric via 332 is in contact with the edges of the inner turn 312 of the first spiral metal layer 310 and the inner turn 322 of the second spiral metal layer 320. The dielectric via 333 is located at opposite side of each of the first spiral metal layer 310 and the second spiral metal layer 320. Specifically, the dielectric via 333 is in contact with edges of the outer turn 311 of the first spiral metal layer 310 and the outer turn 321 of the second spiral metal layer 320.

FIG. 2 exemplarily depicts that the dielectric interlayer 330 in this embodiment includes two dielectric vias 332, 333, but the present disclosure is not limited thereto. In some other embodiments, the dielectric interlayer may include single dielectric via in contact with either the inner turn or the outer turn of the spiral metal layer.

The wiring 220 of the wiring layer 20 may be electrically connected to the first spiral metal layer 310 or the second spiral metal layer 320. Specifically, as shown in FIG. 1, one wiring 220 of the upper wiring layer 20a is electrically connected to the outer turn 311 of the first spiral metal layer 310, and another wiring 220 of the upper wiring layer 20a is electrically connected to the outer turn 321 of the second spiral metal layer 320. One wiring 220 of the lower wiring layer 20b is electrically connected to the inner turn 312 of the first spiral metal layer 310, and another wiring 220 of the lower wiring layer 20b is electrically connected to the inner turn 322 of the second spiral metal layer 320.

An electric current can flow from the one wiring 220 of the upper wiring layer 20a through the first spiral metal layer 310 and the one wiring 220 of the lower wiring layer 20b in sequence, and can flow from the another wiring 220 of the upper wiring layer 20a through the second spiral metal layer 320 and the another wiring 220 of the lower wiring layer 20b in sequence. Therefore, each of the first spiral metal layer 310 and the second spiral metal layer 320 may form an inductor. Moreover, the first spiral metal layer 310, the second spiral metal layer 320 and the dielectric interlayer 330 may together form a capacitor, such as a MIM (Metal-insulator-metal) capacitor.

Figure 3:
FIG. 3 through FIG. 12 are schematic views showing fabrication of the circuit board structure in FIG. 1.

An exemplary fabrication method of the circuit board structure 1 are described hereafter. FIG. 3 through FIG. 12 are schematic views showing fabrication of the circuit board structure in FIG. 1. As shown in FIG. 3, the core 10 is provided. A metal film may be selectively coated on the outer surface of the core 10. For example, a copper film is coated on the outer surface of the core 10. FIG. 3 exemplarily depicts a core 10 without any coating.

Figure 4:
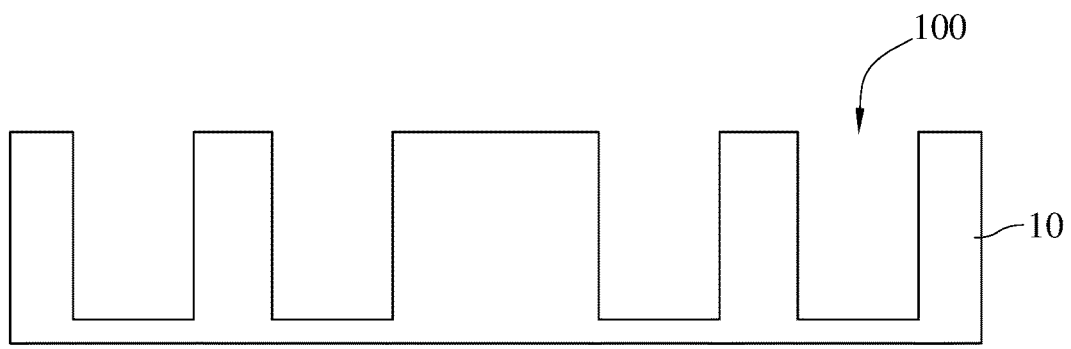
Figure 5:
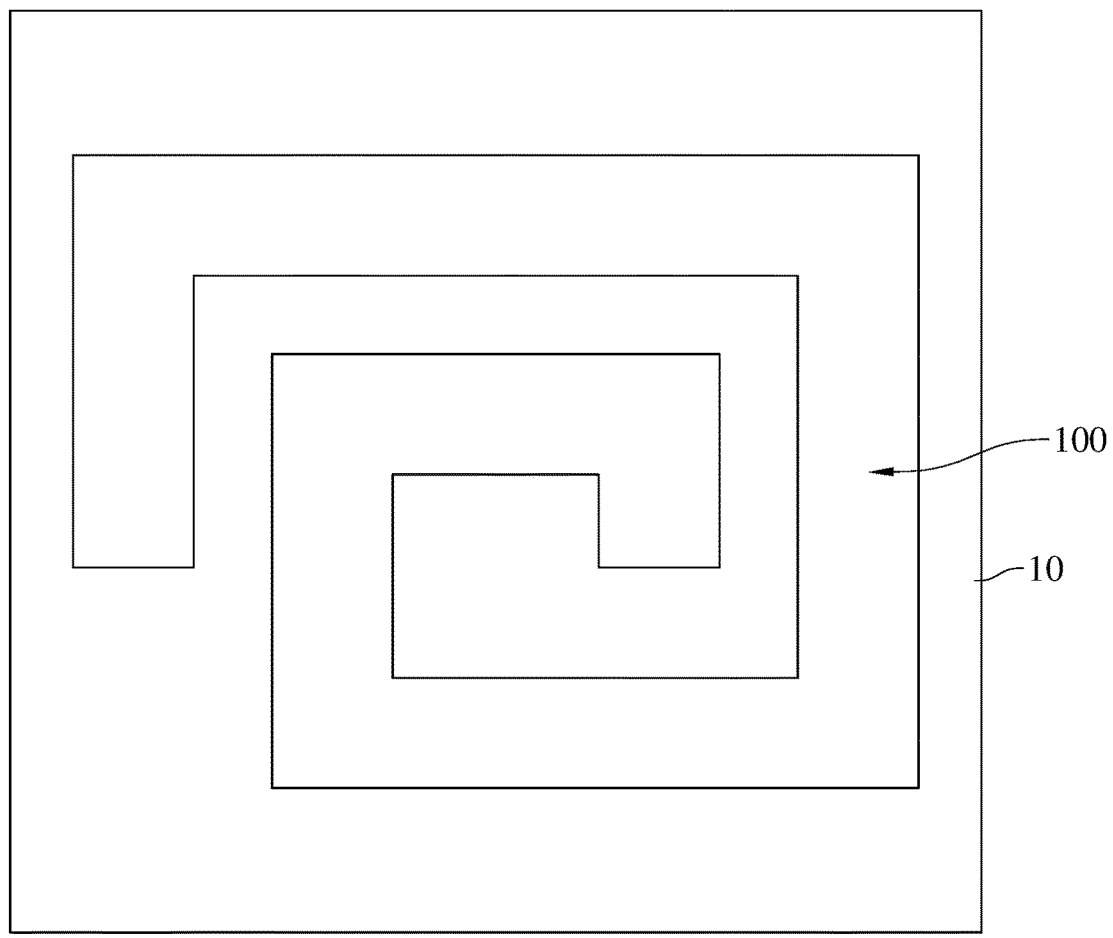

As shown in FIG. 4 and FIG. 5, a spiral trench 100 is formed in the core 10. Herein, FIG. 5 is a top view of the configuration in FIG. 4. The spiral trench 100 extends from the top surface of the core 10 but not through the core 10. The formation of the spiral trench 100 may be implemented by lithography and/or dry etching.

Figure 6:
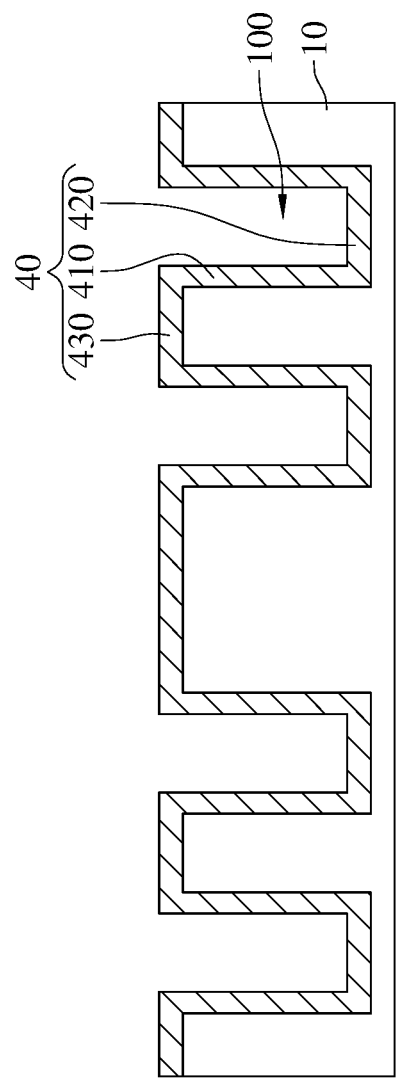

As shown in FIG. 6, a metal layer 40 is formed in the spiral trench 100. Specifically, the metal layer 40 may include a lateral portion 410 on a side wall of the spiral trench 100, a base portion 420 on a bottom surface of the spiral trench 100, and a top portion 430 on the top surface of the core 10. The top portion 430 and the base portion 420 are connected to the lateral portion 410. The formation of the metal layer 40 may be implemented by physical vapor deposition (PVD), chemical vapor deposition (CVD), sputtering, electroless plating and/or electroplating.

Figure 7:
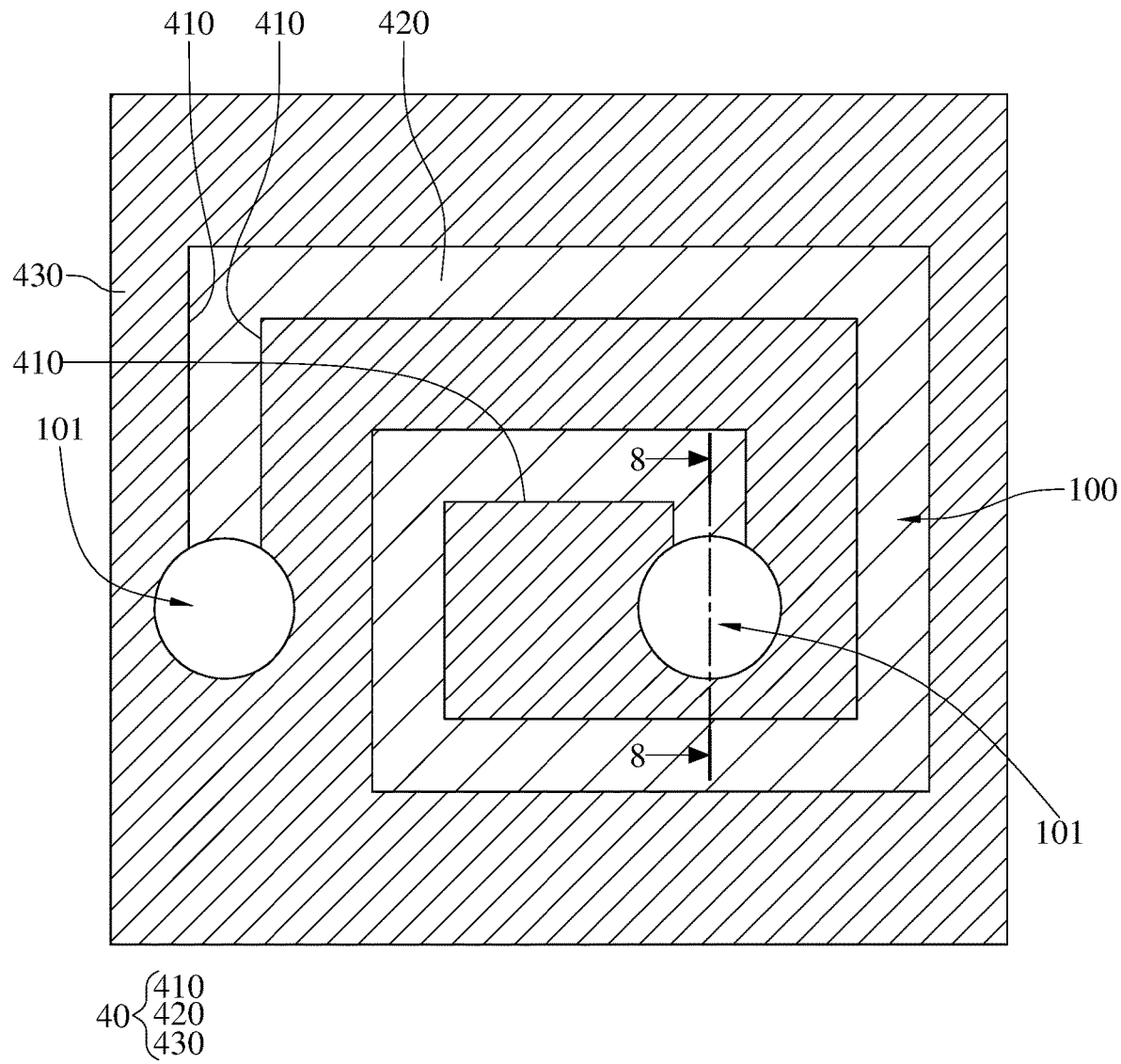
Figure 8:
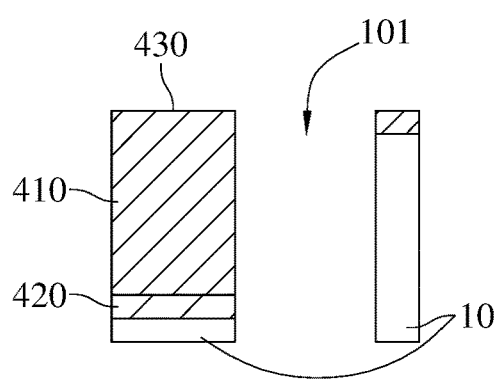

As shown in FIG. 7 and FIG. 8, part of the lateral portion 410 is removed. Herein, FIG. 8 is a cross-sectional view of the configuration along line 8-8 in FIG. 7. The core 10 and the lateral portion 410 may be partially removed at opposite ends of the spiral trench 100 so as to form a through hole 101 communicated with the spiral trench 100. Referring to FIG. 7, since the lateral portion 410 is partially removed at both ends of the spiral trench 100, the metal layer 40 in the spiral trench 100 may be formed in a structure in which two lateral portions 410 are spaced apart by the base portion 420. The formation of the through hole 101 may be implemented by simultaneously removing part of the lateral portion 410 and part of the core 10 by mechanical drilling or laser drilling.

Figure 9:
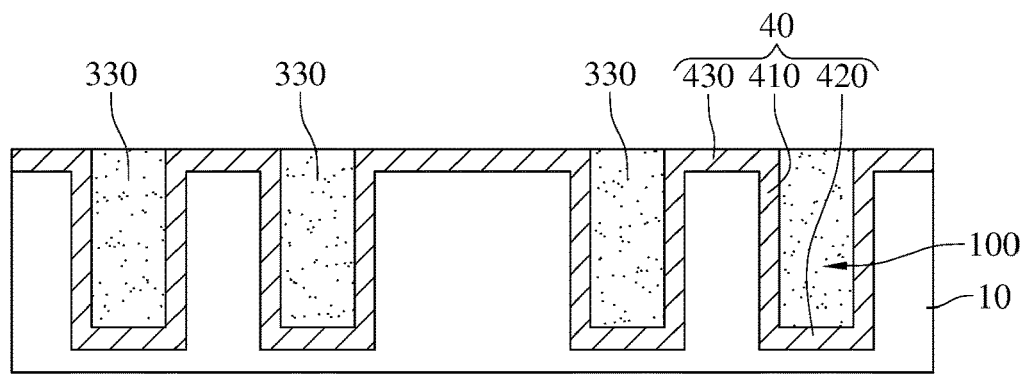
Figure 10:
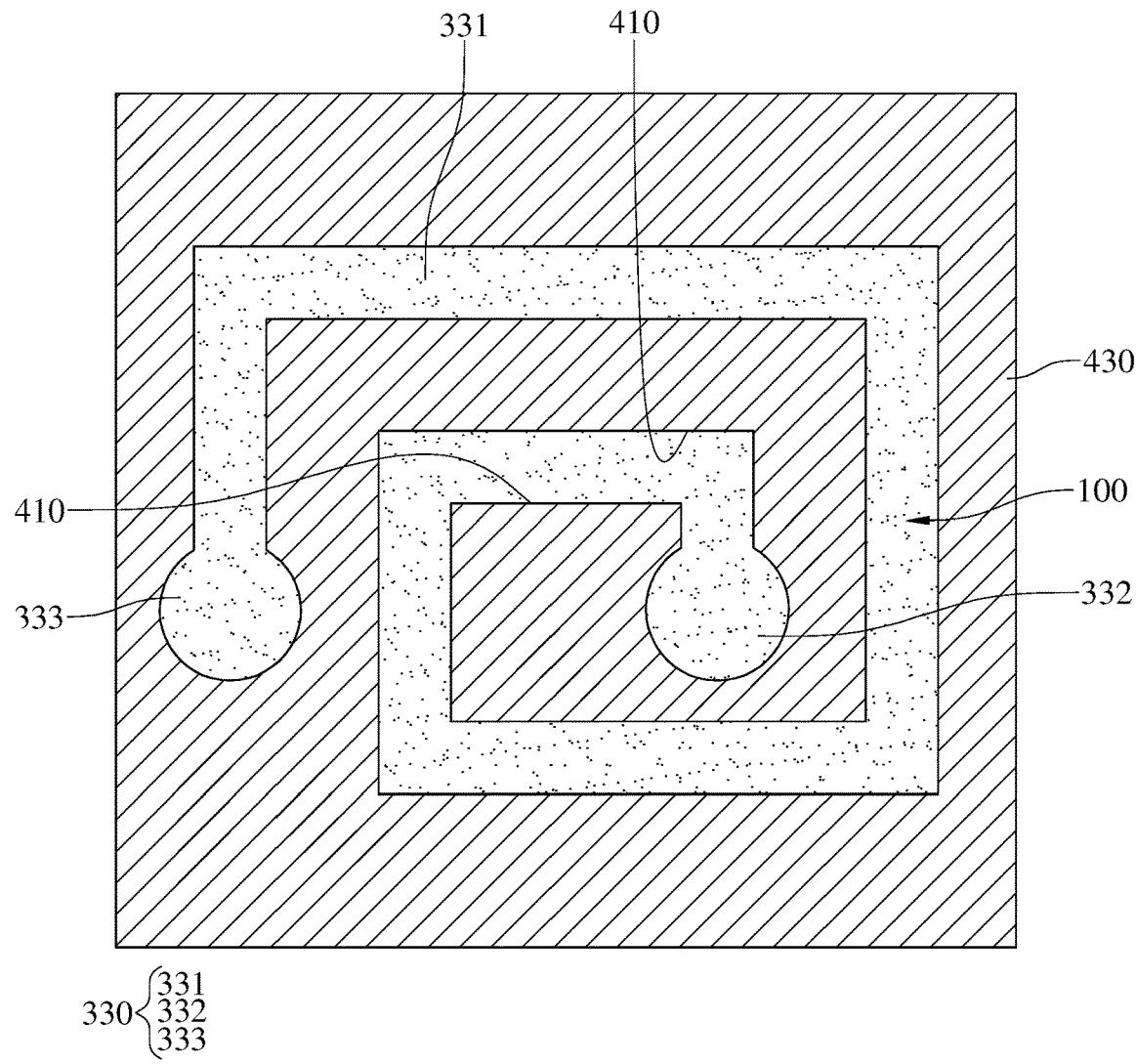

As shown in FIG. 9 and FIG. 10, the dielectric interlayer 330 in contact with the metal layer 40 is formed in the spiral trench 100. Herein, FIG. 10 is a top view of the configuration in FIG. 9. A dielectric material is filled in the spiral trench 100 as well as the through hole 101 and solidified to form the sandwiched portion 331 and the dielectric vias 332, 333 of the dielectric interlayer 330. The dielectric material may be filled by PVD, ink-jet printing or vacuum lamination. Furthermore, the dielectric material may be solidified by baking process, and part of the solidified dielectric material, which is not in the spiral trench 100 and the through hole 101, may be removed by polishing.

Figure 11:
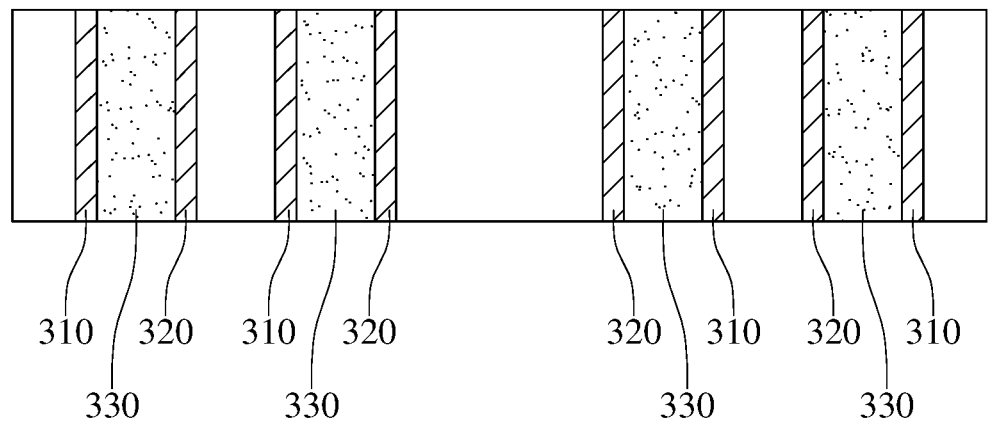

As shown in FIG. 11, the base portion 420 of the metal layer 40 is removed so as to form the first spiral metal layer 310 and the second spiral metal layer 320. Specifically, the base portion 420 and part of the core 10 are removed by thinning the core 10 by polishing, such as by chemical mechanical polishing (CMP) from the bottom surface of the core 10. Furthermore, the top portion 430 of the metal layer 40 is removed. For example, the top portion 430 and part of the dielectric interlayer 330 are removed by CMP from the top portion 430 on the surface of the core 10. Therefore, part of the lateral portion 410 remained on the side wall of the spiral trench 100 forms the first spiral metal layer 310 and the second spiral metal layer 320. The aforementioned steps of polishing may be implemented simultaneously or sequentially. Referring to FIG. 11, the first spiral metal layer 310 and the second spiral metal layer 320 are spaced apart by the dielectric interlayer 330, such that these two spiral metal layers are not connected to each other.

Figure 12:
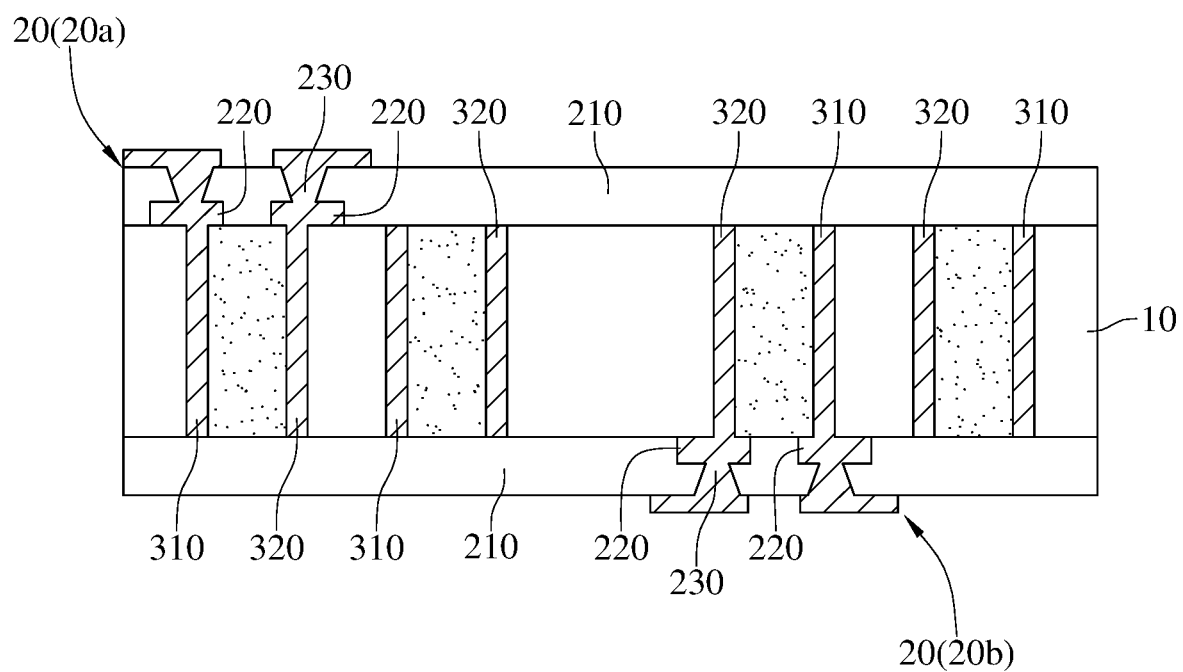

As shown in FIG. 12, the wiring layer 20 is formed such that the wiring 220 is electrically connected to at least one of the first spiral metal layer 310 and the second spiral metal layer 320. Specifically, two dielectric layers 210 are formed on upper and lower sides of the core 10, respectively, and the wiring 220 and the conductive blind hole 230 of respective dielectric layer 210 are formed so as to obtain the upper wiring layer 20a and the lower wiring layer 20b. The two sections of the wiring 220 of the upper wiring layer 20a are electrically connected to the first spiral metal layer 310 and the second spiral metal layer 320, respectively. The two sections of the wiring 220 of the lower wiring layer 20b are electrically connected to the first spiral metal layer 310 and the second spiral metal layer 320, respectively. The formation of the dielectric layer 210 may be implemented by PVD, vacuum lamination or wet coating. The formation of the wiring 220 and the conductive blind hole 230 for each wiring layer 20 may be implemented by lithography, laser drilling and/or coating. Said coating may refer to electroplating or electroless plating.

According to the embodiment of the present disclosure, the first spiral metal layer 310, the second spiral metal layer 320 and the dielectric interlayer 330 included in the buried passive component 30 of the circuit board structure 1 can function as inductor and capacitor, such that it is helpful to enhance a density of the passive elements in the circuit board structure 1. The circuit board structure 1 with high density of passive elements enjoys more amount of space for electric wiring and small size.

Figure 13:
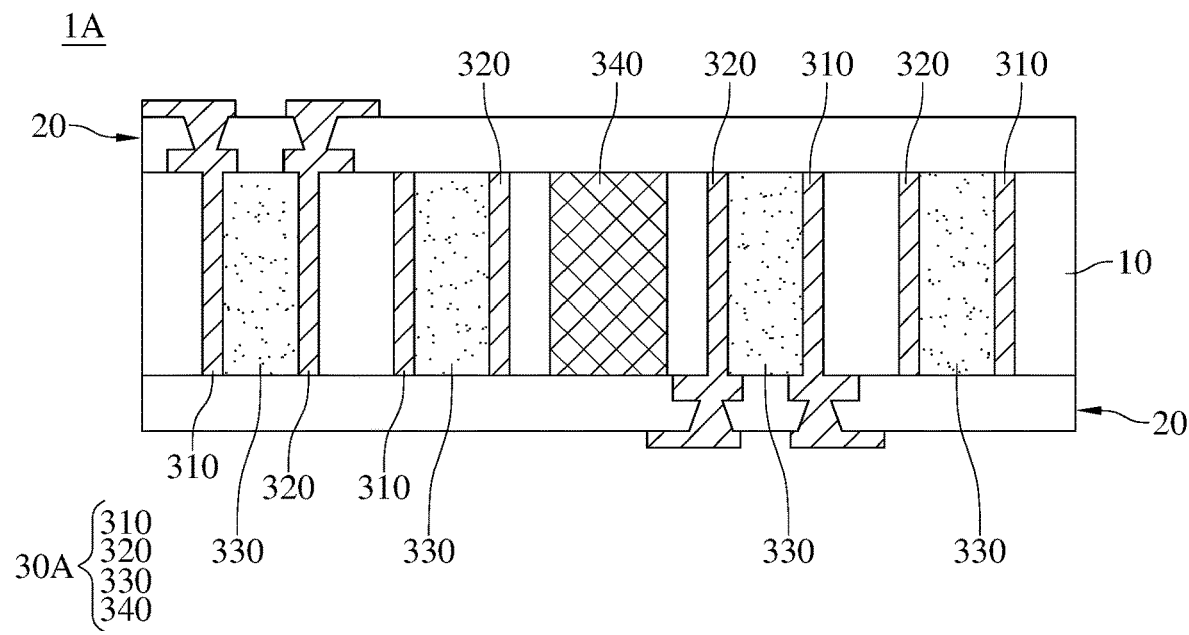
FIG. 13 is a schematic view of a circuit board structure according to another embodiment of the present disclosure.
Figure 14:
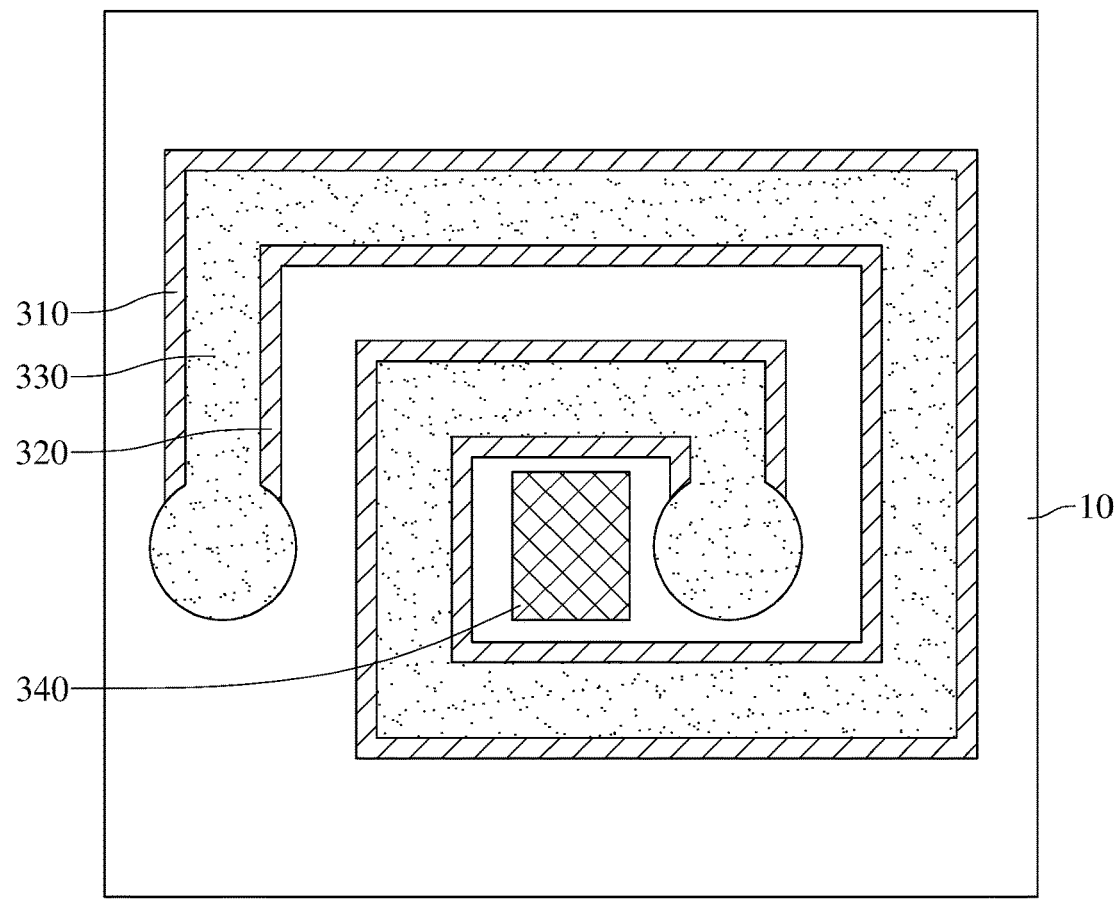
FIG. 14 is a top view of a core and a buried passive component of the circuit board structure in FIG. 13.

According to the present disclosure, the circuit board structure may include a magnetic element. Please refer to FIG. 13 and FIG. 14. FIG. 13 is a schematic view of a circuit board structure according to another embodiment of the present disclosure, and FIG. 14 is a top view of a core and a buried passive component of the circuit board structure in FIG. 13. In this embodiment, a circuit board structure 1A includes a core 10, a wiring layer 20 and a buried passive component 30A. The core 10 and the wiring layer 20 of the circuit board structure 1A are similar or identical to the core 10 and the wiring layer 20 of the circuit board structure 1 in FIG. 1. Any illustration related to similar or identical elements can be referred to the aforementioned description about the circuit board structure 1, and will not be duplicated hereafter.

The buried passive component 30A includes a first spiral metal layer 310, a second spiral metal layer 320, a dielectric interlayer 330 and a magnetic element 340. Any illustration related to the first spiral metal layer 310, the second spiral metal layer 320 and the dielectric interlayer 330 can be referred to the aforementioned description about the circuit board structure 1, and will not be duplicated hereafter.

The magnetic element 340, for example, is a ferric oxide pillar disposed in the core 10. Specifically, the magnetic element 340 is spaced apart from each of the first spiral metal layer 310, the second spiral metal layer 320 and the dielectric interlayer 330. The first spiral metal layer 310 and the second spiral metal layer 320 surround the magnetic element 340, such that the magnetic element 340 is helpful to enhance the effectiveness of the spiral metal layers 310 320 as an inductor. The magnetic element 340 in FIG. 13 and FIG. 14 is in a shape of rectangle and exposed at both top and bottom surfaces of the core 10, while the present disclosure is not limited by the shape, the thickness of the magnetic element 340 and its Z-axis position in the core 10.

Figure 15:
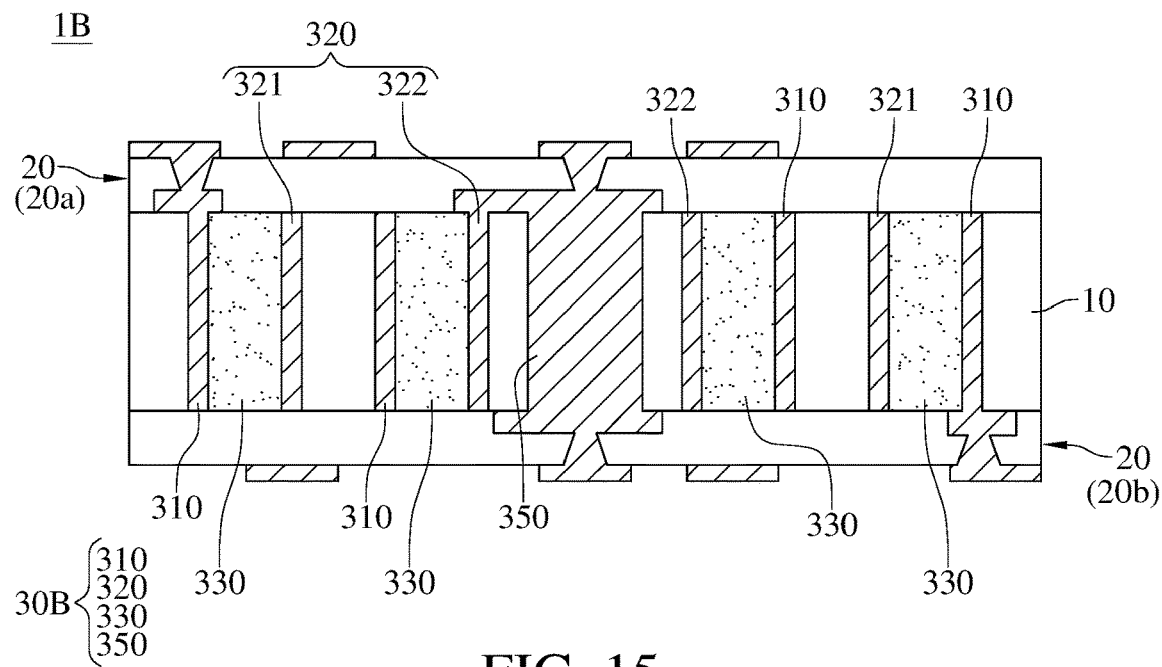
FIG. 15 is a schematic view of a circuit board structure according to still another embodiment of the present disclosure.
Figure 16:
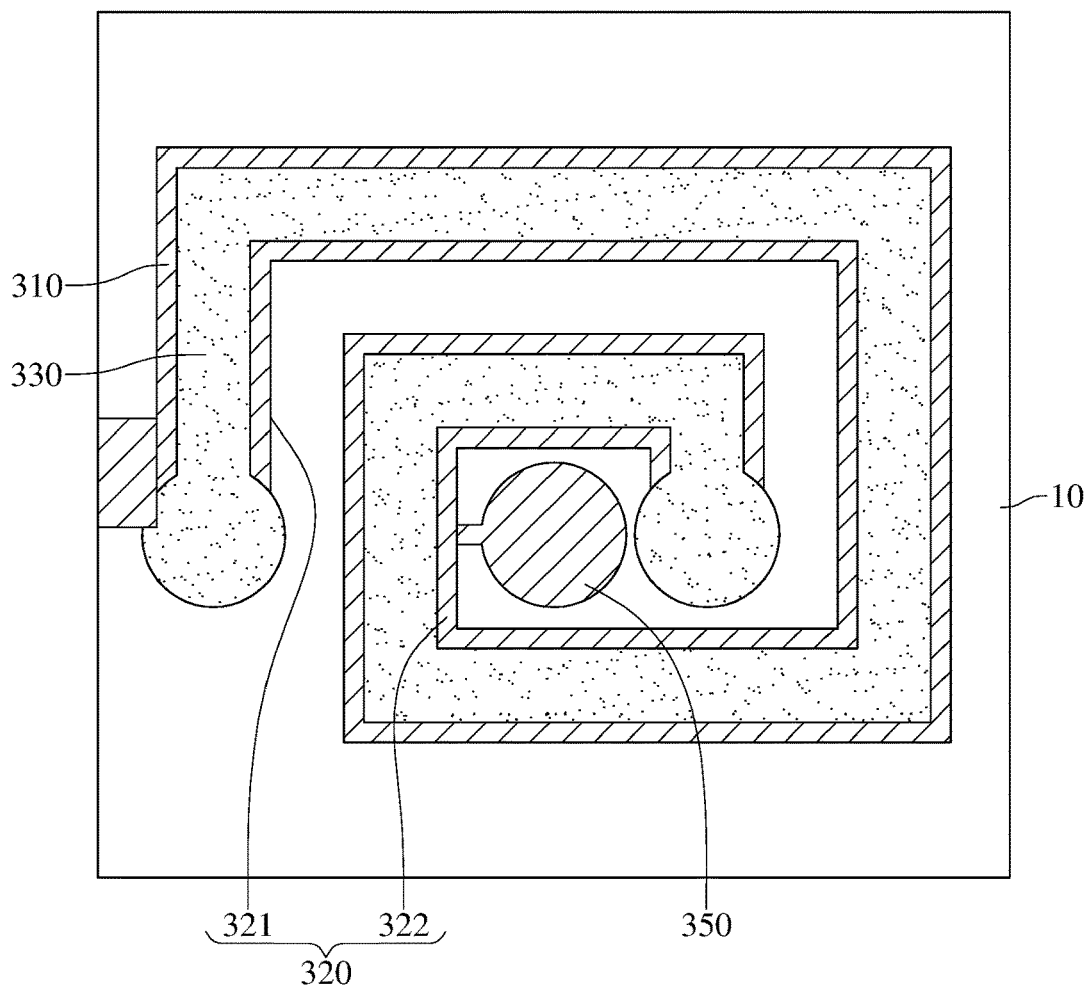
FIG. 16 is a top view of a core and a buried passive component of the circuit board structure in FIG. 15.

According to the present disclosure, the circuit board structure may include a conductive through hole. Please refer to FIG. 15 and FIG. 16. FIG. 15 is a schematic view of a circuit board structure according to still another embodiment of the present disclosure, and FIG. 16 is a top view of a core and a buried passive component of the circuit board structure in FIG. 15. In this embodiment, a circuit board structure 1B includes a core 10, a wiring layer 20 and a buried passive component 30B. The core 10 and the wiring layer 20 of the circuit board structure 1B are similar or identical to the core 10 and the wiring layer 20 of the circuit board structure 1 in FIG. 1. Any illustration related to similar or identical elements can be referred to the aforementioned description about the circuit board structure 1, and will not be duplicated hereafter.

The buried passive component 30B includes a first spiral metal layer 310, a second spiral metal layer 320, a dielectric interlayer 330 and a conductive through hole 350. Any illustration related to the first spiral metal layer 310, the second spiral metal layer 320 and the dielectric interlayer 330 can be referred to the aforementioned description about the circuit board structure 1, and will not be duplicated hereafter.

The conductive through hole 350 is disposed in the core 10. Specifically, the conductive through hole 350, for example, is a through hole formed in the core 10, and a metal film is coated on a side wall of this through hole. The first spiral metal layer 310 and the second spiral metal layer 320 surround the conductive through hole 350, and the conductive through hole 350 is electrically connected to the wiring layer 20 and the second spiral metal layer 320. More specifically, the conductive through hole 350 is provided with its one end electrically connected to the inner turn 322 of the second spiral metal layer 320 through the wiring 220 of the upper wiring layer 20a and its opposite end electrically connected to the inner turn 322 of the second spiral metal layer 320 through the wiring 220 of the lower wiring layer 20b. The conductive through hole 350 is helpful to noise filtering by inductive structure when electric signals are transmitted through the passive component so as to facilitate better signal transmission.

According to the present disclosure, the buried passive component, including two spiral metal layers and a dielectric interlayer therebetween, can function as inductor and capacitor, such that it is helpful to enhance a density of the passive elements in the circuit board structure. The circuit board structure with high density of passive elements enjoys more amount of space for electric wiring and small size.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A circuit board structure, comprising: a core; a wiring layer disposed on the core; and a buried passive component disposed in the core and electrically connected to the wiring layer, the buried passive component comprising: a first spiral metal layer; a second spiral metal layer intertwined with the first spiral metal layer; and a dielectric interlayer disposed between the first spiral metal layer and the second spiral metal layer, wherein the first spiral metal layer and the second spiral metal layer are spaced apart by the dielectric interlayer at least in the core, wherein the dielectric interlayer comprises a sandwiched portion, a first dielectric via and a second dielectric via connected to one another, the sandwiched portion is disposed between the first spiral metal layer and the second spiral metal layer, the first dielectric via and the second dielectric via extend through the core in a thickness direction of the core, the first dielectric via is located at an one side of each of the first spiral metal layer and the second spiral metal layer, and the second dielectric via is located at an opposite side of each of the first spiral metal layer and the second spiral metal layer.

2. The circuit board structure according to claim 1, wherein the dielectric interlayer is in a shape of spiral.

3. The circuit board structure according to claim 1, wherein the first spiral metal layer and the second spiral metal layer extend through the core in a thickness direction of the core.

4. The circuit board structure according to claim 1, wherein each of the first spiral metal layer and the second spiral metal layer forms an inductor.

5. The circuit board structure according to claim 1, wherein the first spiral metal layer, the second spiral metal layer and the dielectric interlayer together form a capacitor.

6. The circuit board structure according to claim 1, wherein the wiring layer comprises a wiring and a dielectric layer, the dielectric layer is disposed on the core, the wiring is located in the dielectric layer, the wiring is electrically connected to the first spiral metal layer or the second spiral metal layer, and a material of the dielectric interlayer has a greater dielectric constant than a material of the dielectric layer of the wiring layer.

7. The circuit board structure according to claim 1, wherein the buried passive component further comprises a magnetic element disposed in the core, the magnetic element is spaced apart from the first spiral metal layer, the second spiral metal layer and the dielectric interlayer, and the first spiral metal layer and the second spiral metal layer surround the magnetic element.

8. The circuit board structure according to claim 1, wherein the buried passive component further comprises a conductive through hole disposed in the core, the first spiral metal layer and the second spiral metal layer surround the conductive through hole, and the conductive through hole is electrically connected to the second spiral metal layer through the wiring layer.

9. The circuit board structure according to claim 8, wherein the second spiral metal layer includes an outer turn and an inner turn connected to each other, and the conductive through hole is electrically connected to the inner turn.

\* \* \* \* \*